(12) United States Patent
Hara

(10) Patent No.: US 6,727,181 B2
(45) Date of Patent: Apr. 27, 2004

(54) ETCHING METHOD AND MANUFACTURING METHOD OF A STRUCTURE

(75) Inventor: Masaki Hara, Kanagawa (JP)

(73) Assignee: Sony Corporation, Tokyo (JP)

( * ) Notice: Subject to any disclaimer, the term of this patent is extended or adjusted under 35 U.S.C. 154(b) by 285 days.

(21) Appl. No.: 09/733,280

(22) Filed: Dec. 8, 2000

(65) Prior Publication Data

US 2001/0021585 A1 Sep. 13, 2001

(30) Foreign Application Priority Data

Dec. 10, 1999 (JP) .......................................... P11-352351

(51) Int. Cl.$^7$ ............................................ H01L 21/302
(52) U.S. Cl. ...................... 438/706; 438/710; 438/712; 438/715; 438/719
(58) Field of Search ................................ 438/706, 707, 438/710, 715, 719, 724, 725

(56) References Cited

U.S. PATENT DOCUMENTS

| | | | | |
|---|---|---|---|---|
| 5,308,442 A | * | 5/1994 | Taub et al. .................... | 216/27 |
| 5,658,471 A | * | 8/1997 | Murthy et al. ................. | 216/27 |
| 6,014,240 A | * | 1/2000 | Floyd et al. ................. | 359/201 |
| 6,121,552 A | * | 9/2000 | Brosnihan et al. .......... | 174/253 |
| 6,150,280 A | * | 11/2000 | Yamashita ................... | 438/707 |
| 6,441,451 B1 | * | 8/2002 | Ikeda et al. ................. | 257/418 |
| 6,483,147 B1 | * | 11/2002 | Lin ............................. | 257/347 |

\* cited by examiner

*Primary Examiner*—Robert Kunemund
*Assistant Examiner*—Binh X Tran
(74) *Attorney, Agent, or Firm*—Sonnenschein, Nath & Rosenthal LLP

(57) ABSTRACT

When a through hole like a pass-through trench is to be made by etching an object to be etched from one of its major surfaces by reactive ion etching or other dry etching, for the purpose of preventing undesirable enlargement of the through hole in size at its terminal end, dry etching is conducted by previously providing a conductor with a higher electric conductivity than the entity in contact with the other surface of the entity in or near the portion for making the through hole. For example, the entity to be etched may be a semiconductor such as Si substrate, and the conductor may be a metal film such as Al film.

22 Claims, 8 Drawing Sheets

TOP SURFACE OF Si SUBSTRATE

*Fig. 9B*

BACK SURFACE OF Si SUBSTRATE

*Fig. 9C*

C-C' CROSS SECTION

LIQUID FOR TEMPERATURE CONTROL

ETCHING METHOD AND MANUFACTURING METHOD OF A STRUCTURE

STATEMENT OF RELATED APPLICATIONS

This application claims priority to Japanese patent application no. JP 11-352351, filed Dec. 10, 1999, the disclosure of which is expressly incorporated by reference herein, to the extent permissible by law.

BACKGROUND OF THE INVENTION

1. Field of the Invention

This invention relates to an etching method and a manufacturing method of a structure, especially suitable for application to fabrication of fine micro structures including those in the technical field of micro electromechanical systems (MEMS), such as micro mirrors.

2. Description of the Related Arts

In the technical field of MEMS, it has been known that any trench made to pass through silicon (Si) substrate by dry etching is inevitably enlarged in width at its terminal end (for example, Transducers '99: J. JIAO et al. pp.546–549). This is caused by an increase of the etching speed at the terminal end of the trench.

When a trench increases its width at the terminal end, a trench configuration, as designed, cannot be obtained, and this disturbs fabrication of micro structures in the field of MEMS.

Moreover, since any etching normally has a difference of ±5% in rate within a wafer surface, almost no over-etching is conducted throughout the entire surface of the wafer. It is not possible to solve the above-indicated problem by means of so-called just etching.

OBJECT AND SUMMARY OF THE INVENTION

It is therefore an object of the invention to provide an etching method and a manufacturing method of a structure using such etching method which are usable for making a trench extending through a substrate by dry etching, or more generally, for making a through hole in a member to be etched by dry etching, and can prevent the through hole from enlarged in dimension at its terminal end.

The Inventor made careful researches toward solution of the above-indicated problem involved in conventional techniques. These researches are outlined below.

Figure 1:
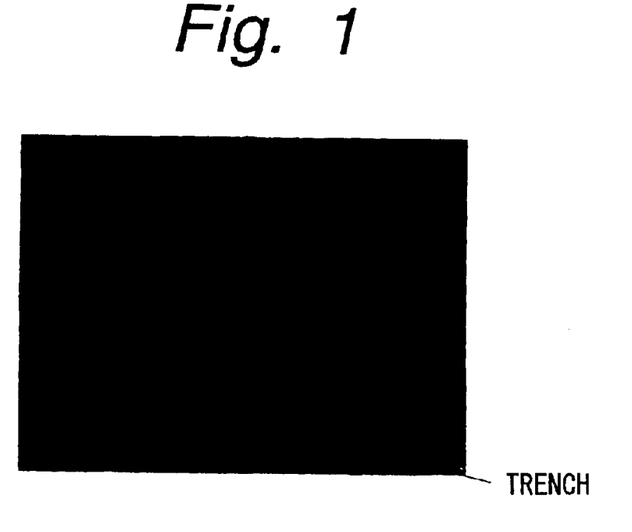
FIG. 1 is a photomicrograph for explaining results of an experiment made by the Inventor.
Figure 2:
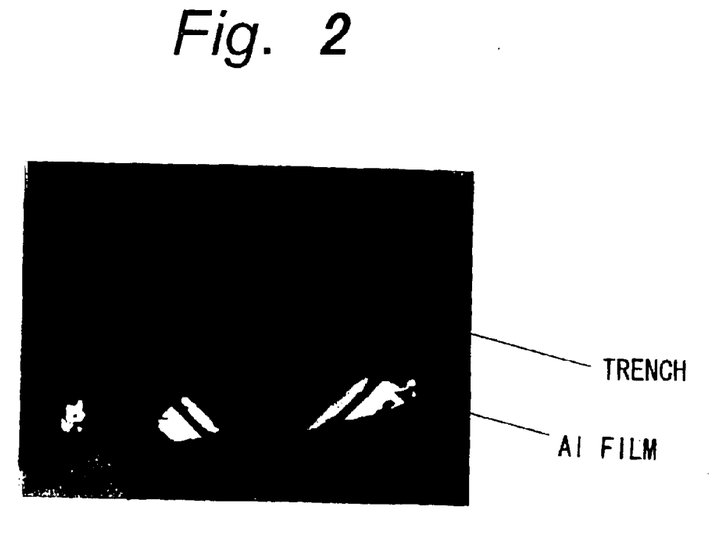
FIG. 2 is a photomicrograph for explaining results of an experiment made by the Inventor.

The Inventor experimentally made a pass-through trench by dry etching of a Si substrate. More specifically, a 10 $\mu$m wide passing-through trench in a 100 $\mu$m thick Si substrate. FIG. 1 is a photomicrograph of the trench formed in the Si substrate taken from its etching-start side, i.e. its side having a resist mask. As shown in FIG. 1, the width of the passing-through trench observed from the etching-start side was approximately 10 $\mu$m. On the other hand, FIG. 2 shows a photomicrograph of the passing-through trench taken from the etching-terminal side and having the same magnification as that of FIG. 1. As shown in FIG. 2, the maximum width of the passing-through trench was approximately 30 $\mu$m at the etching-terminal end, and it was approximate three times the width there of in the etching-start end.

This result of experiments coincided with the result of experiments made by J. JIAO et al. in the point that the terminal end of a pass-through trench was enlarged in width. However, it was probably first found that the width of a pass-through trench increases at its terminal end as large as three times the width at its etching-start side.

The Inventor made a review about the reason of those experimental results. That is, as understood by carefully observing the photomicrograph shown in FIG. 2, the terminal end of the passing-through trench have two portions which are narrower than their neighbor portions, and they are approximately equal to the width of the passing-through trench at its etching-start side. It should be remarked here that, at opposite sides of such portion of the passing-through trench, an Al film stacked on the bottom surface of the Si substrate remains non-etched (which appears white in FIG. 2). This fact can be interpreted to indicate that existence of an Al film on the back surface of a Si substrate near the portion where a pass-through trench passes through is effective for preventing enlargement in width of the passing-through trench at its terminal end.

It is currently unknown what mechanism produces such results. However, the following mechanism can be presumed. That is, as a reason of enlargement in width at the terminal end of the trench made to pass through a Si substrate by dry etching, side walls of the passing-through trench might be electrically charged while the etching progresses, which might bend orbits of ions coming later; ions hitting against the side walls of the trench might increase their speed components normal to the side walls at the terminal end of the trench. In contrast, in the case where an Al film is formed on the bottom surface of the Si substrate near the portion of the terminal end of the passing-through trench, when etching progresses to the terminal end of the trench and the Al film is exposed inside the trench, a charge might quickly move from side walls of the trench onto the Al film and thereby completely cancel, or largely reduce, the charge of the side walls of the passing-through trench, which might considerably alleviate deviation of orbits of subsequent ions, and might prevent that the etching rate increases at the terminal end of the passing-through trench.

Taking those mechanisms into consideration, the Inventor made a further review, and reached to the conclusion that, by previously making a conductor with a sufficiently high electric conductivity on one side corresponding to the terminal end of the trench, more typically, by locating a conductor in contact with the surface corresponding to the terminal end of the trench by any appropriate means, the same effect could be obtained. Through a still further review, the Inventor has come to the conclusion that this technique is effective not only for cases where the entity to be etched is the Si substrate, but also for all cases involving the problem that the terminal end of a through hole is enlarged in size when it is made by etching an object to be etched by dry etching.

The present invention has been made through those studies and reviews by the Inventor.

According to the first aspect of the invention, there is provided an etching method configured to make a through hole by etching an object to be etched from one of major surfaces thereof by dry etching, comprising:

the dry etching being conducted under the condition where a conductor with a higher electric conductivity than that of the entity is in contact with the entity at least in or near a location for making the through hole.

According to the second aspect of the invention, there is provided a manufacturing method of a structure including a step of making a through hole by etching an object to be etched from one of major surfaces thereof by dry etching, comprising:

the dry etching being conducted under the condition where a conductor with a higher electric conductivity than that of the entity is in contact with the entity at least in or near a location for making the through hole.

In the present invention, the entity to be etched may be essentially any that involves the problem of undesirable enlargement in size of a terminal end of a through hole made therethrough by dry etching. Specifically, it may be any semiconductor, for example, among Si, and element semiconductors or compound semiconductors like Ge, SiGe and GaAs, for example. Further, the entity to be etched may be a single-layered film, such as Si substrate, which is made of a single kind of substance, or may be a multi-layered structure stacking multiple films made of two or more kinds of substances, such as a multi-layered film stacking two Si films via a $SiO_2$ film, for example. In such a multi-layered structure, it is often desired to pierce only a certain layer through by etching. Also in that case, since the through hole may enlarge at boundaries if respective layers are different in etching rate, the effect of preventing undesirable enlargement of the through hole at its terminal end can be obtained by merely providing a conductor at a location where the etching of the layer should be stopped.

Preferably used as the conductor is one having a sufficiently high electric conductivity as compared with the entity to be etched. More specifically, any of Al, Au, Pt, Ti, Cr, W and Mo, for example, may be used as the conductor. Alternatively, a compound of a conductive metal like metal silicide, electrically conductive organic matter like conductive polymer, or other like material, can be used as the conductor. This conductor may be a conductive film formed on the entirety of the other surface of the entity to be etched, or may be a conductive film in form of a fine-line pattern, for example, formed near the site for making the through hole on the other surface of the entity to be etched. The latter form of conductive film is more advantageous because its coverage may be so small that its presence on the final structure does not invite problems, and it need not be removed by a later step after etching. In the case where the entity to be etched is a semiconductor such as Si, it is also possible to introduce an n-type impurity or a p-type impurity onto the other surface of the entity to be etched by ion implantation and use the impurity-introduced layer as the conductor.

The conductor is not limited to those made by film-making techniques, but may be a molten conductor such as molten metal. Metals suitable for this purpose are, for example, low-melting-point metals like Ga, Hg, solder and In, for example. If such a molten conductor is used, etching can be conducted by the following steps, for example. First, a low-melting-point conductor is set on a wafer stage in a dry etching apparatus. Then, after maintaining the wafer stage at a temperature above the melting point of the conductor and melting the conductor, a wafer (such as Si substrate) as the entity to be etched is put thereon. Subsequently, after fixing the wafer on the wafer stage by decreasing the temperature of the wafer stage below the melting point of the conductor, the through hole is made by dry etching of the wafer. In certain cases, the through hole may be made by melting the conductor by maintaining the wafer stage at a temperature above the melting point of the conductor, then putting thereon the wafer as the entity to be etched, and conducting dry etching of the wafer.

The dry etching may be essentially any that involves the problem of undesirable enlargement of the terminal end of a through hole made by etching the entity to be etched. For example, it may be an ion-used dry etching such as reactive ion etching (RIE), for example. Especially when the entity to be etched is Si, $SF_6$ gas and $C_4F_8$ gas are used as the etching gas.

Regarding the aspect ratio of the through hole (=(vertical size)/(horizontal size)) to be made through the entity to be etched, there is no essential limitation. Typically, however, it is 3 or larger, with which it is considered difficult for conventional dry etching to make a through hole uniform in size throughout its entire length including its terminal end. It is preferably not smaller than 5, more preferably not smaller than 8 and more preferably not smaller than 10. The upper limit of the aspect ratio will be determined mainly depending upon the performance of the dry etching apparatus used, and it is not definite. However, a criteria is about 20 to 50.

The aspect ratio of a through hole in a multi-layered film as the entity to be etched is given as the ratio of the vertical size of the through hole with respect to its horizontal size when viewed from the entirety of the multi-layered film.

As summarized above, according to the invention, since a through hole is made by conducting dry etching while a conductor with a higher electric conductivity than that of an object to be etched is held in contact with the other surface of the entity to be etched in or near the location for making the through hole, when the etching progresses to the terminal end of the through hole and the conductor is exposed inside the through hole, charges electrically charged by ion injection quickly move from side walls of the through hole onto the conductor, thereby completely or significantly remove the electric charge of the side walls inside the through hole, and thereby significantly decrease deviation of orbits of subsequent ions. Therefore, acceleration of the etching rate at the terminal end of the through hole is effectively prevented.

The above, and other, objects, features and advantage of the present invention will become readily apparent from the following detailed description thereof which is to be read in connection with the accompanying drawings.

DETAILED DESCRIPTION OF THE PREFERRED EMBODIMENTS

Explained below are embodiments of the invention with reference to the drawings. In all of the drawings illustrating the embodiments, common or equivalent parts or elements are labeled with common reference numerals.

First explained is the first embodiment of the invention.

Figure 3:
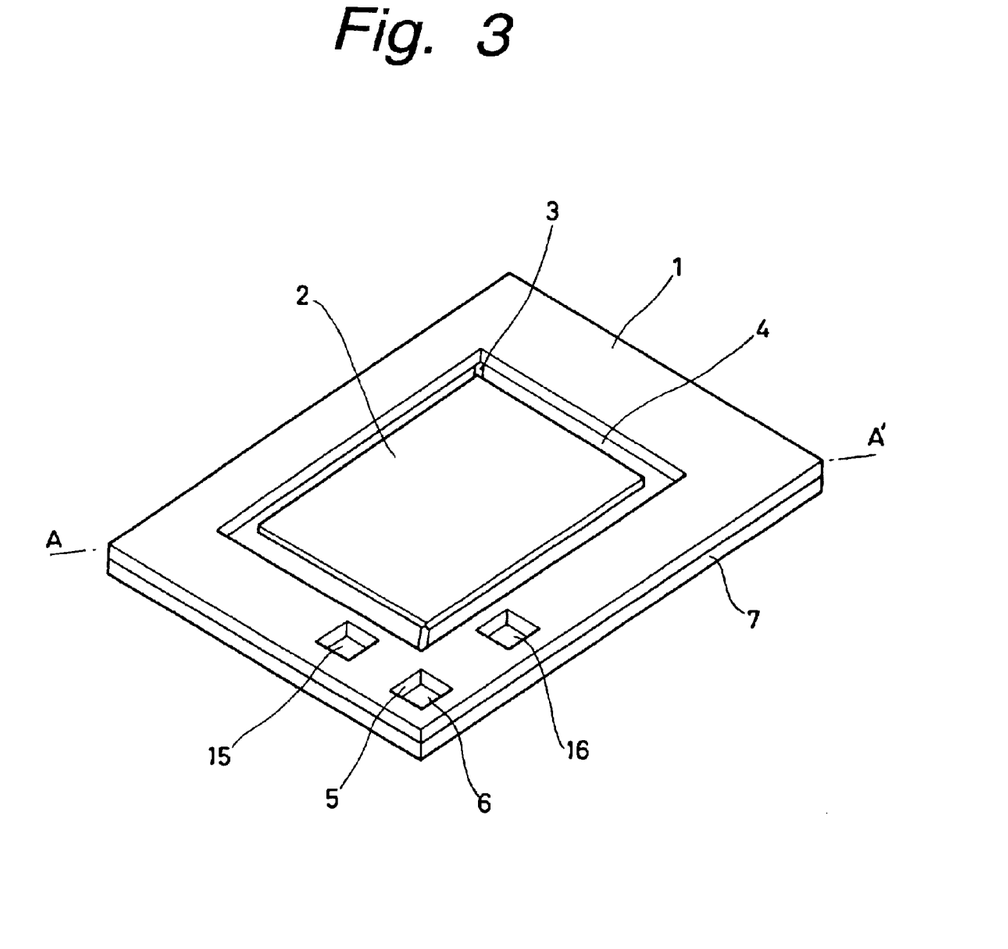
FIG. 3 is a perspective view of a micro mirror according to a first embodiment of the invention.

For convenience in explanation, configuration of a micro mirror manufactured by the first embodiment is first explained. FIG. 3 shows this micro mirror as a fished product, and FIG. 4 shows an aspect of this micro mirror, separating a Si substrate having formed a mirror body from a glass substrate having formed a mirror driving electrode.

Figure 4:
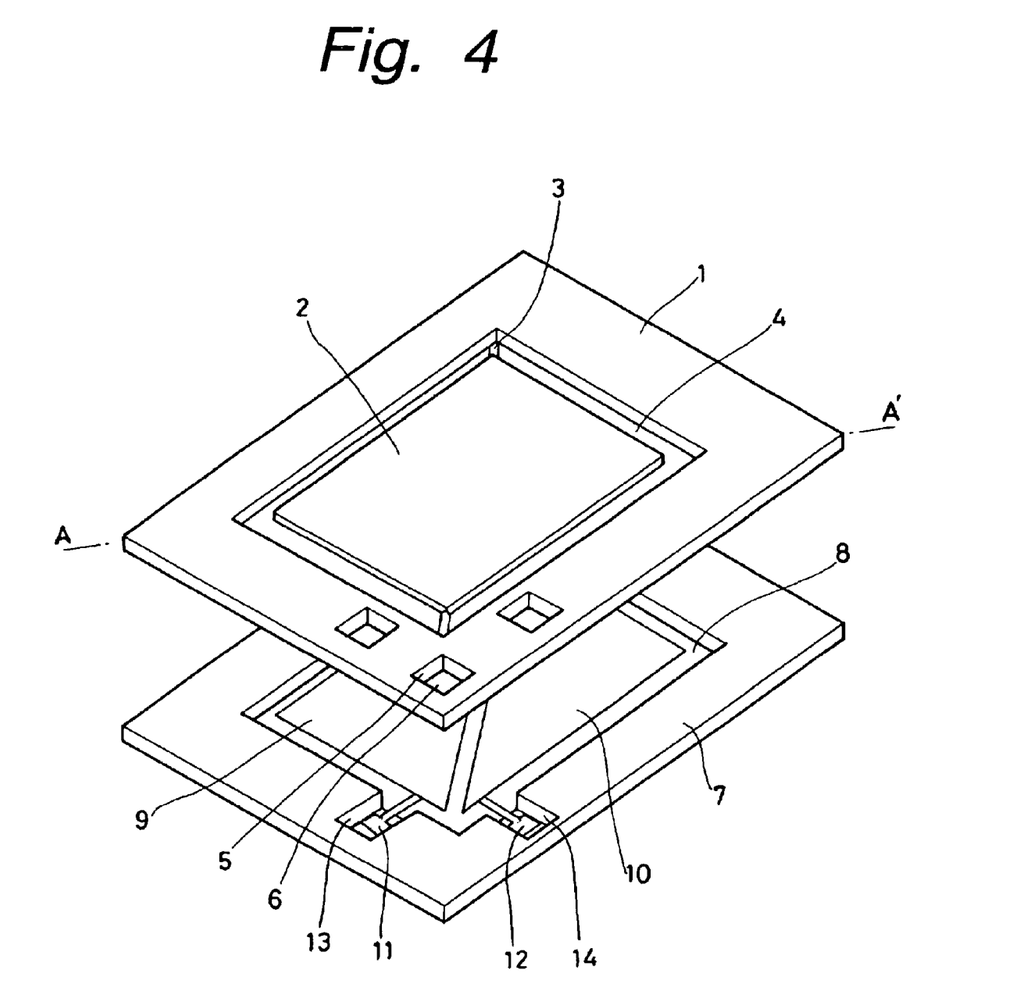
FIG. 4 is an exploded, perspective view of the micro mirror according to the first embodiment of the invention.

As shown in FIG. 3 and FIG. 4, in this micro mirror, a mirror 2, square-shaped, for example, is formed on a Si substrate 1, square-shaped, for example, in a form supporting a pair of diagonal ends of the mirror 2 with hinges (beams) 3 made of $SiN_x$, for example. The mirror 2 is isolated from the Si substrate 1 around it by a pass-through trench 4, except for the portions of the hinges 3. Upper surfaces of the mirror 2 and the Si substrate 1 lie on a common plane, but the mirror 2 is thinner than the Si substrate 1. Although not shown, the upper surface of the mirror 2 has formed a mirror plane of an Al film whereas the bottom surface of the mirror 2 has formed an upper electrode for driving the mirror. The Si substrate 1 has a contact hole 5 made to electrically connect the upper electrode and an external terminal, not shown. At the bottom portion of the contact hole 5, a wiring metal 6 is formed to connect to the upper electrode via the bottom surface of the hinge 3. On the other hand, a glass substrate 7 having the same shape as the Si substrate 1 has a rectangular recess 8 made in form of the same contour as the passing-through trench 4. On the bottom surface of the recess 8, a pair of right-triangular lower electrodes 9, 10 having a diagonal direction of the recess 8 parallel to the hinges 3 as their hypotenuses are formed face-to-face. Connected to these lower electrodes 9, 10 are lead-out electrodes 11, 12. These lead-out electrodes 11, 12 are extended to lead-out portions 13, 14 formed in the recess 8, respectively. The Si substrate 1 has contact holes 15, 16 for electrically connecting the lead-out electrodes 11, 12 to external terminals, not shown. The Si substrate 1 and the glass substrate 7 are bonded together by anode connection.

The micro mirror is configured to swing about the hinges 3 with electrostatic attraction force produced between the upper electrode on the bottom surface of the mirror 2 and the lower electrodes 9, 10 by application of a voltage between them.

FIGS. 5A through 5F and 6A through 6F show a manufacturing method of the micro mirror. These figures are cross-sectional views taken along the A–A' line either in FIG. 3 or in FIG. 4. FIG. 5A to FIG. 6F are not equal in scale of reduction from FIGS. 3 and 4.

Figure 5A:
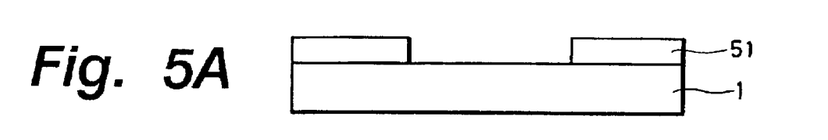
FIGS. 5A through 5F are cross-sectional views for explaining a manufacturing method of a micro mirror according to the first embodiment of the invention.

First as shown in FIG. 5A, a resist mask 51 is formed on one of major surfaces of the Si substrate 1 (wafer) by photo lithography for the purpose of making a recess of a size covering the upper electrode and the hinge portion.

Figure 5B:
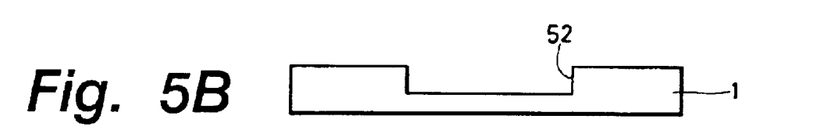

Next as shown in FIG. 5B, using the resist mask 51, the Si substrate 1 is etched by dry etching like RIE, for example, to a predetermined depth to thereby make a recess 52. The resist mask 51 is removed thereafter.

Figure 5C:
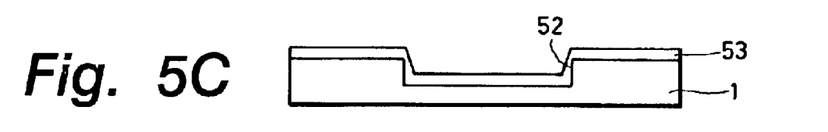

Next as shown in FIG. 5C, an Al film 53 is stacked on the entire substrate surface by vacuum evaporation or sputtering, for example.

Figure 5D:
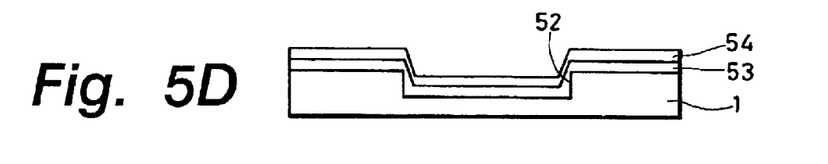

Next as shown in FIG. 5D, a $SiN_x$ film 54 is stacked on the entire substrate surface by CVD, for example.

Figure 5E:
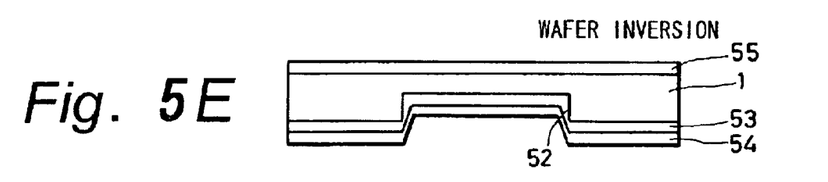

Next as shown in FIG. 5E, the Si substrate 1 is reversed to orient the other major surface of the Si substrate 1 upward, and an Al film 55 is stacked on its entire surface by vacuum evaporation or sputtering, for example.

Figure 5F:
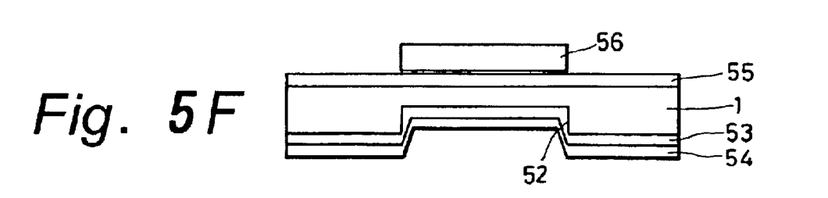

Next as shown in FIG. 5F, a resist mask 56 is formed on the Al film 55 by photolithography for the purpose of making a mirror pattern.

Figure 6A:
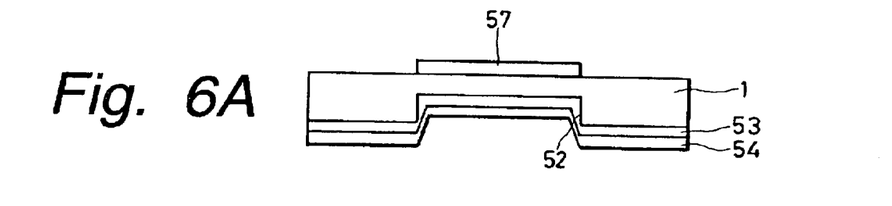
FIGS. 6A through 6F are cross-sectional views for explaining a manufacturing method of a micro mirror according to the first embodiment of the invention.

Next as shown in FIG. 6A, using the resist mask 56, a mirror surface 57 is made by wet-etching the Al film 55. The resist mask 56 is removed thereafter.

Figure 6B:
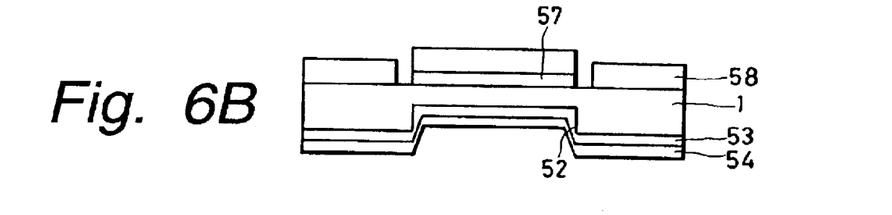

Next as shown in FIG. 6B, a resist mask 58 for use in passing-through etching is formed by photolithography.

Figure 6C:
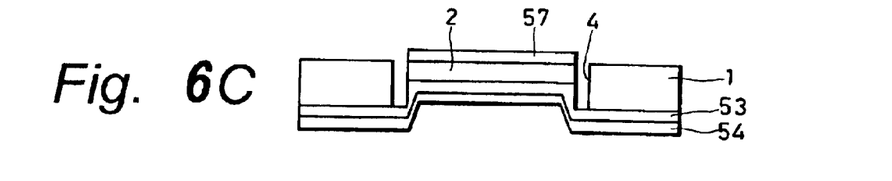

Next as shown in FIG. 6C, the Si substrate 1 is introduced into a dry etching apparatus, in which, using $SF_6$ gas and $C_4F_8$ gas as the etching gas, by RIE using high-density plasma, passing-through etching of the Si substrate 1 is conducted by using a resist mask 58, thereby making the passing-through trench 4 and the mirror 2. The resist mask 58 is removed thereafter. Presumably, during this dry etching, since the Al film 53 lies on the bottom surface of the Si substrate 1, charges of ions entering into the passing-through trench 4 are absorbed by the Al film 53, and prevent the side walls of the passing-through trench 4 from being charged electrically.

Figure 6D:
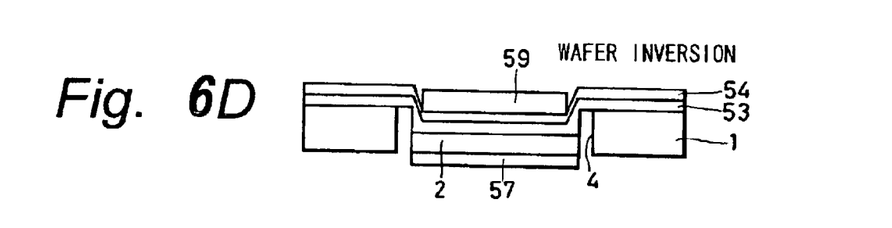

Next as shown in FIG. 6D, the Si substrate is put upside down, and a resist mask 59 is formed on the bottom surface of the Si substrate 1 by photo lithography for the purpose of patterning the upper electrode and the hinge portions.

Figure 6E:
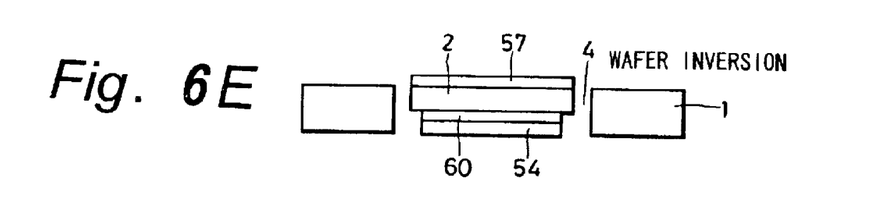

Next as shown in FIG. 6E, using the resist mask 59, the $SiN_x$ film 54 id selectively removed by dry etching. Subsequently, the Al film 53 is etched by wet etching, thereby to make the hinges 3 and the upper electrode 60. In this status, the $SiN_x$ film 54 overlies the upper electrode 60. Also in the hinge portions, the same configuration appears. FIG. 6 shows the Si substrate 1 in an inverted posture form that of FIG. 6D.

Figure 6F:
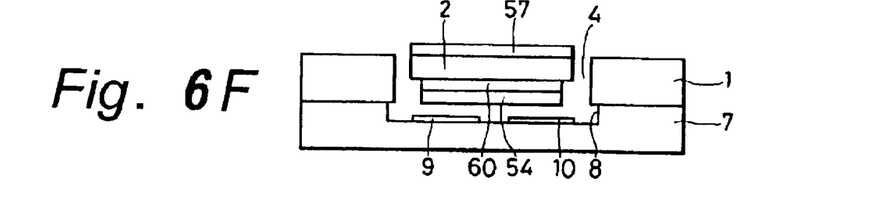

Next as shown in FIG. 6F, the Si substrate 1 having formed the mirror structure through the foregoing steps is bonded to the glass substrate 7 previously having formed the lower electrodes 9, 10 and others in the recess 8, by using anode connection. As a result, the micro mirror as shown in FIGS. 3 and 4 is completed.

Figure 7:
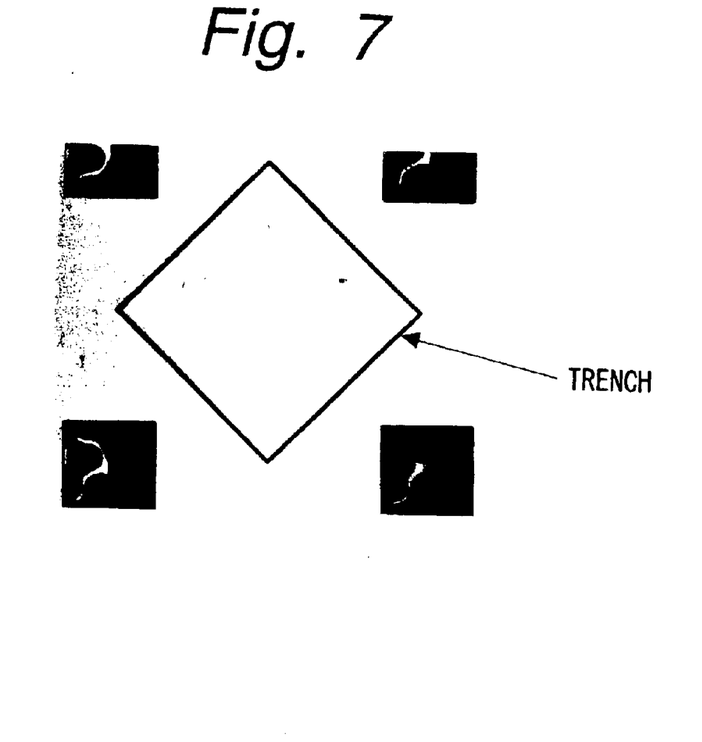
FIG. 7 is a photomicrograph for explaining results of an experiment made by the Inventor.
Figure 8:
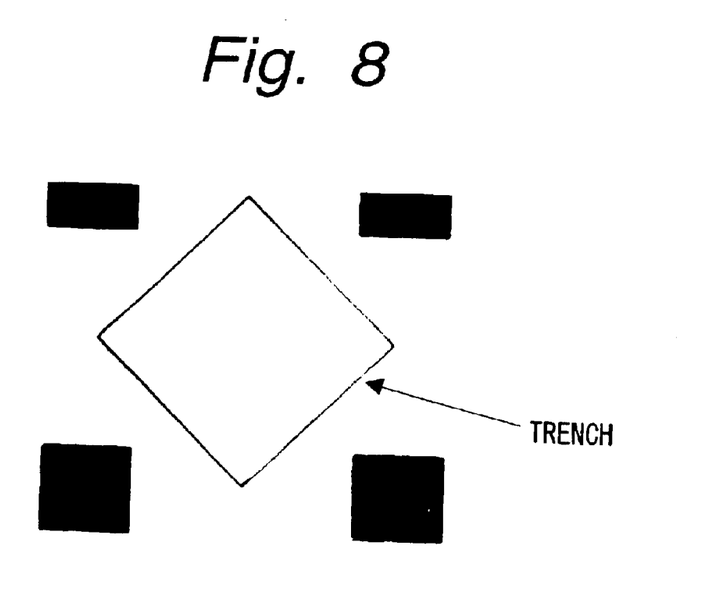
FIG. 8 is a photomicrograph for explaining results of an experiment made by the Inventor.

Shown in FIGS. 7 and 8 are results of optical microscopic observation of a portion of the passing-through trench 4 of the micro mirror made through those steps from the top surface side (the side to be etched) and the bottom side (the side of the Al film 53) of the Si substrate 1. It is understood from FIGS. 7 and 8 that the Al film 53 formed on the bottom surface of the Si substrate 1 leads to uniforming the width of the passing-through trench 4 both at the top surface and the bottom surface of the Si substrate 1. At that time, etching time was equal to that of the case of FIGS. 1 and 2. It should be remarked here that the $SiN_x$ film 54, being an insulating film, is stacked on the Al film 53, and the Al film 53 is not grounded. Moreover, even when a similar experiment was done by additionally stacking a photo resist film on the $SiN_x$ film 54, that effect was not degraded.

As explained above, according to the first embodiment, when making the passing-through trench 4 through the Si substrate 1 by dry etching, since the Al film 53 is previously stacked on one surface of the Si substrate 1 corresponding to the terminal end, it is possible to substantially overcome the problem of undesirable enlargement in width of the passing-through trench 4 at its terminal end and make the passing-through trench 4 having a good cross-sectional configuration with a width as designed and determined by the resist mask 58. At the same time, length of the hinges 3 determined upon dry etching for making the passing-through trench 4 can be also fixed as designed. Although an accuracy in size not exceeding about 5% is usually required for hinges 3 used in MEMS, this degree of accuracy can be readily ensured. Because the hinges 3 are very accurate in size, malfunction of vibration properties of the mirror 2 caused by the hinges 3 can be prevented.

Next explained is the second embodiment of the invention. The second embodiment is useful for fabricating a MEMS device having a substrate bonded. That is, in case of MEMS devices, after a Si substrate and a glass substrate are bonded together by anode connection, the Si substrate often undergoes passing-through etching. This is because, in many cases, the Si substrate after passing-through etching is too fragile to resist a subsequent photo lithographic process. In this case, however, it is substantially impossible to process the bottom side of the Si substrate (the surface bonded to the glass substrate) after the passing-through etching. In this case, therefore, the method according to the first embodiment configured to previously stack the conductive film on the entire bottom surface of the Si substrate cannot be used. Taking it into consideration, the second embodiment is directed to a method improving that drawback.

Figure 9A:
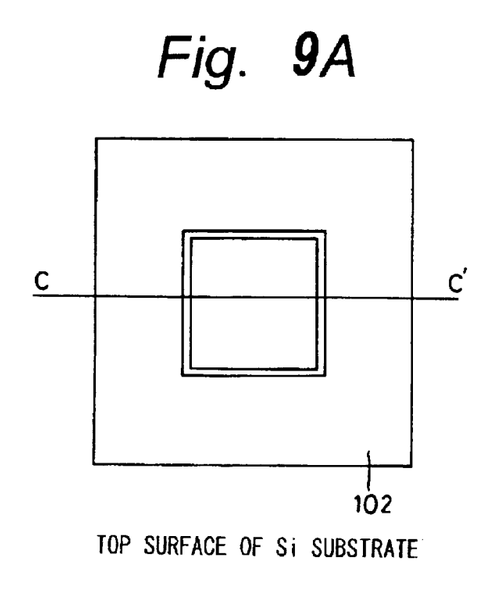
FIGS. 9A through 9C are cross-sectional views for explaining a passing-through etching method according to a second embodiment of the invention.
Figure 9B:
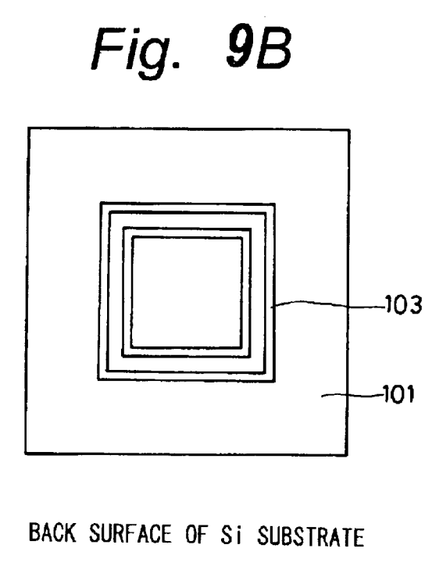
Figure 9C:
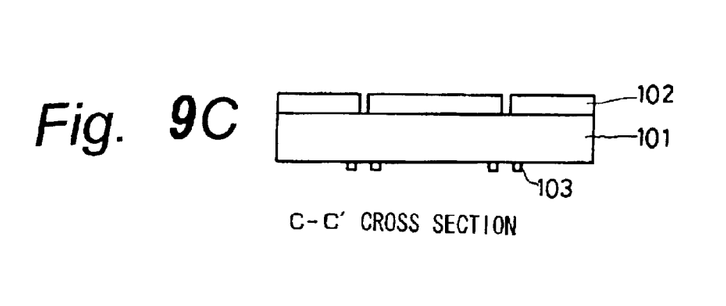

FIGS. 9A through 9C show a Si substrate prior to passing-through etching in the second embodiment. FIG. 9A is a view of the top surface of the Si substrate, FIG. 9B is a view of the bottom surface of the Si substrate, and FIG. 9C is a cross-sectional view taken along the C–C' line of FIG. 9A.

As shown in FIGS. 9A through 9C, the second embodiment first makes a resist mask 102 on one of major surfaces (top surface) of a Si substrate 101 by lithography for the purpose of making a pass-through trench. On the other major surface (bottom surface) of the Si substrate 101, elongated Al patterns 103 (guide metal) are formed to extend along opposite sides of the region for making the passing-through trench. Positional relation between the resist mask 102 and the linear Al patterns 103 is such that the linear Al patterns 103 surround a linear opening of the resist mask 102. The linear Al patterns 103 may be made by first stacking an Al film on the entire bottom surface of the Si substrate 101, then making a resist mask on the Al film by photolithography, and etching the Al film by RIE using the resist mask.

Figure 10:
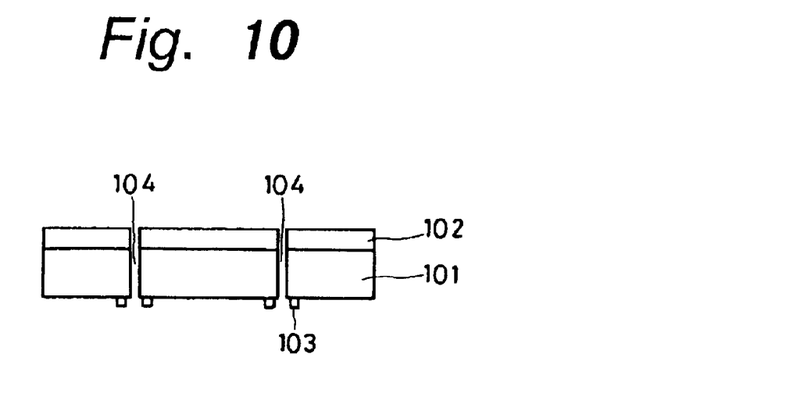
FIG. 10 is a cross-sectional view for explaining a passing-through etching method according to the second embodiment of the invention.
Figure 11:
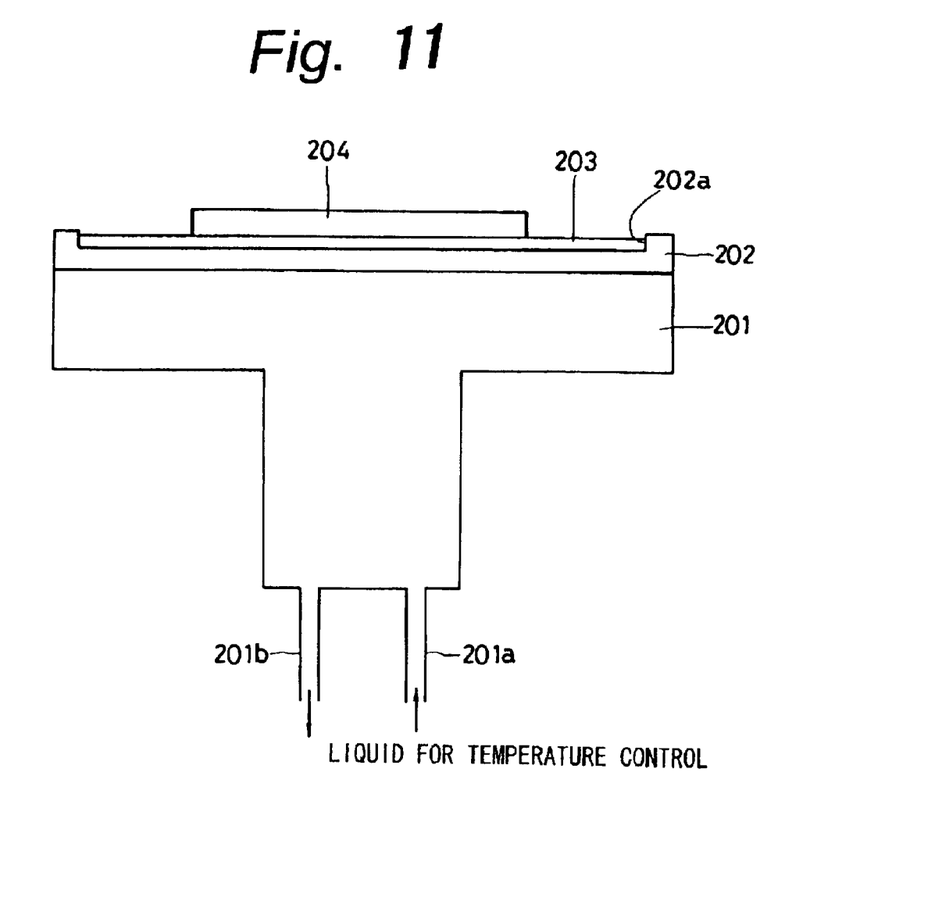
FIG. 11 is a cross-sectional view for explaining a passing-through etching method according to a third embodiment of the invention.

After that, using the resist mask 102, the Si substrate 101 undergoes passing-through etching from its top surface by dry etching such as RIE similar to that of the first embodiment, for example. As a result, as shown in FIG. 10, the passing-through trench 104 is obtained. The resist mask 102 is removed thereafter. During this dry etching, since the linear Al patterns 103 lie on the bottom surface of the Si substrate 101 closely to opposite sides of the region for making the passing-through trench, charges of ions entering into the passing-through trench 104 are absorbed by the linear Al patterns 103, and this prevents side walls of the passing-through trench 104 from being electrically charged.

As explained above, according to the second embodiment, in case of making a pass-through trench 104 through the Si substrate 101 by dry etching, since the linear Al patterns 103 are previously formed at opposite sides of the region for making the passing-through trench 104 on one surface of the Si substrate 101 corresponding to the terminal end, it is possible to substantially overcome the problem of undesirable enlargement in width of the passing-through trench 104 at its terminal end and thereby make the passing-through trench 104 having a good cross-sectional configuration with a width as designed and determined by the resist mask 102. In this case, even when a glass substrate is bonded to the bottom of the Si substrate 101, the passing-through trench 104 can be made with a good form. Additionally, since the linear Al patterns 103 are very fine and may be left in the final structure without any problems, a step of its removal can be omitted, and the process is simplified.

Next explained is the third embodiment of the invention. The third embodiment is directed to ensuring good passing-through etching without performing any particular processing on the part of the Si substrate.

As shown in FIG. 10, in the third embodiment, a wafer holder 202 is first put on a wafer stage 201 in a dry etching apparatus, such as RIE apparatus. The wafer holder 202 has formed a recess 202a. The wafer holder 202 can be controlled in temperature by introducing a temperature-controlled liquid into the inside of the wafer stage 201 and removing it from an outlet 201b. In the recess 202a of the wafer holder 202, Ga (having the melting point of 29.78° C.) 203 is contained as the low-melting-point metal. Then, this wafer holder 202 is maintained at a temperature above the melting point of Ga to melt this Ga 203, and a Si substrate 204 to be etched is put on the molten Ga 203. On one major surface of the Si substrate 204, which is to be etched, a resist mask, not shown, for making a pass-through trench is previously formed. Subsequently, temperature of the wafer holder 202 is decreased to a value below the melting point of Ga. As a result, the Si substrate 204 is fixed onto the wafer holder 202 while maintaining electric contact with the wafer holder 202 via Ga 203. After that, under that condition, the Si substrate 204 is etched by dry etching like RIE similar to the first embodiment by using the resist mask. The resist mask is removed thereafter. During this dry etching, since Ga 203 is in contact with the bottom surface of the Si substrate 204, charges of ions entering into the passing-through trench are absorbed by molten Ga 203, and it is prevented that side walls of the passing-through trench are electrically charged. After that, the wafer holder 202 is again maintained at a temperature above the melting point of Ga to melt Ga 203, and the Si substrate 204 is removed from the wafer holder 202. As explained above, according to the third embodiment, in case of making a pass-through trench through the Si substrate 204 by dry etching, by previously applying Ga 203 in contact with a surface of the Si substrate 204 corresponding to the terminal end, it is possible to prevent the problem of undesirable enlargement in width of the passing-through trench at its terminal end and improve cross-sectional configuration of the passing-through trench to have a width as designed and determined by the resist mask. In this case, since a conductive film such Al film need not be formed on the bottom of the Si substrate 204, the process is simplified.

Example 1 as an Example of the First Embodiment

A 500 μm-square mirror 2 is supported at opposite ends by $SiN_x$ hinges 3 on a 100 μm thick Si substrate 1. Each hinge 3 is 10 μm wide, 20 μm long and 2 μm thick. The mirror surface is made by depositing a 200 nm thick Al film by vacuum evaporation. Contact holes 5, 15, 16 are 200 μm squares.

The glass substrate 7 is 200 μm thick Pyrex glass. A 10 μm deep recess 8 is formed in the glass substrate 7 by etching, and Al-made lower electrodes 9, 10 are formed therein. Each of these lower electrodes 9, 10 is right, isosceles triangular with two 200 μm-long sides equal.

For the purpose of cutting out the mirror 2 from the Si substrate 1, the following process of passing-through etching is conducted. A resist mask 51 is formed as preparation for etching for making a recess 52 in the bottom surface of the 100 μm thick Si substrate 1. After that, in a RIE apparatus using RF plasma of $SF_6$ gas, the Si substrate 1 undergoes dry etching, and a 2 μm deep recess 52 is made.

Thereafter, the Al film 53 is stacked to the thickness of 200 nm on the entire substrate surface by using a vacuum evaporation apparatus, and the $SiN_x$, 1 μm thick, is stacked thereon by CVD.

Then, the Si substrate 1 is reversed upside down, and the Al film 53 to be used as the mirror surface is stacked on the Si substrate 1 to the thickness of 200 nm. A resist mask 56 for making a mirror pattern is formed on the Al film 55, and wet etching is conducted in phosphoric acid by using the resist mask 56 to thereby make the mirror surface 57.

After that, a resist mask 58 for passing-through etching is formed, and passing-through etching is executed by a so-called Bosch process which alternately supplies $SF_6$ gas and $C_4F_8$ gas in a RIE apparatus using high-density plasma. It is considered here that, even though ions enter into the passing-through trench 4, side walls of the passing-through trench 4 are not electrically charged because electric charges are absorbed by the Al film 53 stacked on the bottom surface of the Si substrate 1. As a result, a pass-through trench 4 having a good cross-sectional configuration could be obtained. Almost all of the Al film 53 was maintained unetched by RIE.

After that, the Si substrate 1 was reversed, and a resist mask 59 was formed on the back surface of the Si substrate 1. Subsequently, using this resist mask 59, hinges 3 made of $SiN_x$ was formed by dry etching of the $SiN_x$ film 54 in a RIE apparatus using $CF_4+O_2$ gas, and the upper electrode 60 is next made by wet etching of the Al film 53 in phosphoric acid. One of the hinge portions, not shown, has the same configuration as the hinge portion appearing on the drawings.

On the other hand, separately prepared as the glass substrate 7 is Pyrex glass having formed a 10 μm deep recess 8 and lower electrodes 9, 10 in the recess 8. Then, by again reversing the Si substrate 1, bringing the Si substrate 1 and the glass substrate 7 into close contact in atmospheric air, maintaining them at the temperature of 380° C., bonding them by anode connection while applying the voltage of 1 kV between them, the micro mirror was completed.

As a result of the above-explained passing-through etching process, the passing-through trench 4 having a good cross-sectional configuration could be made in the Si substrate 1, and the mirror 2 could be cut out from the Si substrate 1. Width of the passing-through trench 4 was uniformly about 10 μm on both the top surface and the bottom surface of the Si substrate 1.

Example 2 as an Example of the Second Embodiment

Example 2 is a passing-through etching process in a manufacturing process of a micro mirror. However, explanation about hinge portions supporting the mirror is omitted here.

On the top surface of the Si substrate 101, a resist mask 102 if formed for use in passing-through etching for cutting out a mirror having each side being 1000 μm long from the Si substrate 101. Width of the opening of the resist mask 102 was 10 μm.

On the bottom surface of the Si substrate 101, a linear Al pattern 103 is made by wet etching of a 200 nm thick Al film in phosphoric acid. The Al pattern 103 is square, as a whole, as being drawn with a 20 μm thick line, and it has a positional relation with the resist mask 102 as shown in FIG. 9C. Distance in the direction parallel to the Si substrate 101 from the linear Al pattern 103 to the portion without the resist, i.e., the open portion of the resist mask 102, was 10 μm.

In this status, by generating plasma while alternately supplying $C_4F_8$ gas and $SF_6$ gas and using the resist mask 102, passing-through etching of the Si substrate 101 was conducted. Even after the etching progressed and made the passing-through trench 104, side walls of the passing-through trench 104 were not electrically charged, and the trench was not degraded in cross-sectional configuration.

According to this Example 2, even under the status with the Si substrate 101 being bonded to the glass substrate by anode connection, equivalently good etching can be made. Since the linear Al pattern 103 is a structure locally existing near the passing-through trench 104, even when it remains, it is immaterial.

Through the above-explained process, also for the Si portion of the bonded substrate, the passing-through etching could make a good cross-sectional configuration of the trench.

Example 3 as an Example of the Third Embodiment

Ga 203 as a metal having a low melting point is introduced into a recess 202a of a wafer holder 202 put on a wafer stage 201 of a RIE apparatus. The wafer holder 202 was maintained at 40° C. to melt Ga 203, and a 100 μm thick Si substrate 204 was set thereon, while paying attention to prevent Ga 203 from coming onto the Si substrate 204 and not to leave air between the Si substrate 204 and Ga 203. After that, temperature of the wafer holder 202 is lowered to 5° C. to cure Ga 203, and the Si substrate 203 was fixed in electrical contact with the wafer holder 202. On the Si substrate 204, a 10 μm wide resist mask was previously made for the purpose of passing-through etching.

Under the status, passing-through etching of the Si substrate 204 was conducted by dry etching using the resist mask and alternately using $SF_6$ gas and $C_4F_8$ gas. After the etching, the wafer holder 202 was again held at 40° C. to melt Ga 203, and the Si substrate 204 was removed from the wafer holder 202. Cross-sectional configuration of the passing-through trench obtained was good also at its terminal end portion. This is because, electric charge supplied from ions during etching could move away into G 203, and contributed to good passing-through etching. In this Example 3, since any particular processing is required on the part of the Si substrate 204, it is an effective method as far as the small amount of residual Ga on the Si substrate 204 is immaterial.

Having described specific preferred embodiments of the present invention with reference to the accompanying drawings, it is to be understood that the invention is not limited to those precise embodiments, and that various changes and modifications may be effected therein by one skilled in the art without departing from the scope or the spirit of the invention as defined in the appended claims.

That is, numerical values, structures, configurations, materials, film-stacking methods and processes, for example, proposed in the first, second and third embodiments, and Examples 1, 2 and 3, are mere exemplary forms of the invention, and the invention may employ any other appropriate numerical values, structures, configurations, materials, film-stacking methods and processes, if necessary.

For example, in the second embodiment, although the linear Al pattern 103 has a closed pattern, but this is not indispensable, and an intermittent linear Al pattern 103 may be used.

In the third embodiment, Ga 203 is used as the low-melting-point metal. However, also usable are other lo-melting-point metals such as Hg (having the melting point of −38.8° C.), solder (including 38% of Pb and 62% of Sn, and having the melting point of 183° C.) and In (having the melting point of 156.6° C.), for example. If appropriate, dry etching may be conducted while maintaining Ga 203 molten. In this case, however, it would be preferable to hold the Ga 203 hidden by the Si substrate 204 from plasma for the purpose of preventing contamination of walls of the etching chamber.

Furthermore, the present invention is applicable to any manufacturing method of various MEMS devices such as sensors using Si substrates other than micro mirrors, which need passing-through etching.

As described above, according to the invention, since a through hole is made through an object to be etched by dry etching under the condition having a conductor with a higher electric conductivity than the entity in contact with the other surface of the entity at least in or near the region for making the through hole, undesirable enlargement of the through hole in size at its terminal end can be prevented. Therefore, MEMS devices and other structures can be fabricated precisely.

What is claimed is:

1. An etching method configured to make a through hole by etching an object from a surface thereof by dry etching, comprising:

the dry etching being conducted under the condition where a conductor with a higher electric conductivity than that of an entity is in contact with the entity at least in or near a location for making the through hole; and wherein the through hole is made by setting the conductor with a high melting point on a wafer stage in a city etching apparatus; maintaining the wafer stage at a temperature above the melting point of the conductor to melt the conductor and putting a wafer as the entity thereon; and hereunder conducting the dry etching of the wafer.

2. The etching method according to claim 1 wherein the entity to be etched is made of a semiconductor.

3. The etching method according to claim 1 wherein the entity to be etched is made of silicon.

4. The etching method according to claim 1 wherein the conductor is a conductor film formed on the entire surface of the other surface of the entity to be etched.

5. The etching method according to claim 1 wherein the conductor is a conductor film fanned on a location of the other surface of the entity near the region for making the through hole.

6. The etching method according to claim 1 wherein the conductor is a metal.

7. The etching method according to claim 1 wherein the through hole is made by setting the conductor with a melting point on a wafer stage in a dry etching apparatus; maintaining the wafer stage at a temperature above the melting point of the conductor to melt the conductor and putting a wafer as the entity thereon; fixing the wafer onto the wafer stage by lowering temperature of the wafer stage to a level lower than the melting point of the conductor, and thereafter conducting the dry etching of the wafer.

8. The etching method according to claim 1 wherein the dry etching is conducted by using $SF_6$ gas and $C_4F_8$ gas.

9. The etching method according to claim 1 wherein the dry etching uses jour.

10. The etching method according to claim 1 wherein the dry etching is reactive ion etching.

11. The etching method according to claim 1 wherein the through hole has an aspect ratio not smaller than 3.

12. The etching method according to claim 1 wherein the through hole has an aspect ratio not smaller than 5.

13. The etching method according to claim 1 wherein the through hole has an aspect ratio not smaller than 8.

14. The etching method according to claim 1 wherein the through hole has an aspect ratio not smaller than 10.

15. A manufacturing method of a structure including a step of making a through hole by etching an object to be etched from one of major surfaces thereof by dry etching, comprising:

the dry etching being conducted under the condition where a conductor with a higher electric conductivity than that of the entity is in contact with the entity at least in or near a location for making the through hole; and wherein the through hole is made by setting the conductor with a high melting point on a wafer stage in a dry etching apparatus; maintaining the wafer stage at a temperature above the inciting point of the conductor to melt the conductor and putting a wafer as the entity thereon; and hereunder conducting the dry etching of the wafer.

16. The manufacturing method of claim 15, wherein the dry etching is conducted by using $S_6$ gas and $C_4F_8$ gas.

17. The manufacturing method of claim 15, wherein the dry etching uses ions.

18. The manufacturing method of claim 15, wherein the dry etching is reactive ion etching.

19. The manufacturing method of claim 15, wherein the through hole has an aspect ratio not smaller than 3.

20. The manufacturing method of claim 15, wherein the through hole has an aspect ratio not smaller than 5.

21. The manufacturing method of claim 15, wherein the through hole has an aspect ratio not smaller than 8.

22. The manufacturing method of claim 15, wherein the through hole has an aspect ratio not smaller than 10.

* * * * *